United States Patent
You et al.

(10) Patent No.: US 11,402,266 B2
(45) Date of Patent: Aug. 2, 2022

(54) METHOD AND SYSTEM FOR IMPROVING COUNTING RATE OF SUPERCONDUCTING NANOWIRE SINGLE PHOTON DETECTOR

(71) Applicants: SHANGHAI INSTITUTE OF MICROSYSTEM AND INFORMATION TECHNOLOGY, CHINESE ACADEMY OF SCIENCES, Shanghai (CN); UNIVERSITY OF CHINESE ACADEMY OF SCIENCES, Beijing (CN)

(72) Inventors: Lixing You, Shanghai (CN); Chaolin Lv, Shanghai (CN); Weijun Zhang, Shanghai (CN); Hao Li, Shanghai (CN); Zhen Wang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 16/966,468

(22) PCT Filed: Apr. 10, 2018

(86) PCT No.: PCT/CN2018/082539
§ 371 (c)(1),
(2) Date: Dec. 27, 2020

(87) PCT Pub. No.: WO2019/148651
PCT Pub. Date: Aug. 8, 2019

(65) Prior Publication Data
US 2021/0131867 A1    May 6, 2021

(30) Foreign Application Priority Data
Feb. 2, 2018   (CN) .......................... 201810107671.6

(51) Int. Cl.
*G01J 1/46*   (2006.01)
*G01J 1/04*   (2006.01)
(Continued)

(52) U.S. Cl.
CPC ............... *G01J 1/46* (2013.01); *G01J 1/0425* (2013.01); *G01J 1/0429* (2013.01); *G01J 1/08* (2013.01);
(Continued)

(58) Field of Classification Search
CPC .......... G01J 1/46; G01J 1/0425; G01J 1/0429; G01J 2001/442; H01L 39/10; H01P 3/06
See application file for complete search history.

(56) References Cited

U.S. PATENT DOCUMENTS

2016/0377230 A1\*  12/2016  Chuard ................. G01J 1/0252
                                                               62/447

OTHER PUBLICATIONS

Chen et al, "Superconducting nano-wire single-photon detector readout circuit has power divider which divides detector output signal into two paths that are sent to external test device and load bias circuit respectively to match polarization beam", Dec. 2013, CN 103439012 A.\*

(Continued)

*Primary Examiner* — Kevin K Pyo

(57) ABSTRACT

The present disclosure provides a method and system for improving a counting rate of a superconducting nanowire single photon detector. The method includes: coupling an electrical attenuator in series with an output end of the superconducting nanowire single photon detector; the electrical attenuator includes an input end and an output end, and the input end of the electrical attenuator is coupled with the output end of the superconducting nanowire single photon detector. The present disclosure couples the electrical attenuator in series with the output end of the superconducting nanowire single photon detector. Since the configuration (Continued)

of the electrical attenuator is a resistor network, it can act as a series resistor and can also reduce the response pulse amplitude of the superconducting nanowire single photon detector. The present disclosure can improve the counting rate of the superconducting nanowire single photon detector, while keeping the detection efficiency high.

9 Claims, 3 Drawing Sheets

(51) Int. Cl.
   *G01J 1/08*      (2006.01)
   *H01L 39/10*     (2006.01)
   *H01P 3/06*      (2006.01)
   *G01J 1/44*      (2006.01)

(52) U.S. Cl.
   CPC ................ *H01L 39/10* (2013.01); *H01P 3/06* (2013.01); *G01J 2001/442* (2013.01)

(56) References Cited

OTHER PUBLICATIONS

Chen et al, "SNSro dielectric system dielectric interference resistance improving device, has biasing tree provided with DC port, DC and RF port and RF port, where DC and RF portis connected with one end of SNSH port", Aug. 2013, CN 103245424 A.*

* cited by examiner

METHOD AND SYSTEM FOR IMPROVING COUNTING RATE OF SUPERCONDUCTING NANOWIRE SINGLE PHOTON DETECTOR

CROSS REFERENCE TO RELATED APPLICATION

This is a Sect. 371 National Stage of PCT International Application No. PCT/CN2018/082539, filed on 10 Apr. 2018, which claims priority of a Chinese Patent Application No. 2018101076716 filed on 2 Feb. 2018, the contents of which are incorporated herein by reference in its entirety for all purposes.

BACKGROUND

Field of Disclosure

The present disclosure relates to the technical field of photodetector devices, in particular, to a method and system for improving a counting rate of a superconducting nanowire single photon detector.

Description of Related Arts

As a star single photon detector in recent years, the superconducting nanowire single photon detectors (SNSPD) have the advantages of extremely high detection efficiency, extremely low dark count and ultra-low timing jitter at the same time. These advantages are applied to quantum information science experiments such as quantum communication and quantum computing. However, the development of quantum communication and quantum computing has an urgent need for high-speed and high-efficiency SNSPDs. At present, the detection efficiency can reach more than 90%, but with the increase of the input light intensity, the detection efficiency will drop soon as a result of the amplifier coupling capacitor, which results in a low count rate.

There are many ways to improve the count rate of SNSPDs, such as cryogenic DC-coupled amplifier based on semiconductor transistor, but the design is very difficult; or capacitive grounding scheme based on resistive power divider and coaxial line with short-circuit terminal, but it requires more circuit components and will deteriorate the time jitter of the detector; or array scheme based on multi-pixel, but it is limited by the process level of technology, and the device yield decreases as the number of pixels increases.

SUMMARY

The present disclosure provides a method and system for improving a counting rate of a superconducting nanowire single photon detector, to solve the problem that when the superconducting nanowire single photon detector is coupled with the coupling capacitor of the amplifier, the detection efficiency decreases significantly as the counting rate increases.

The present disclosure provides a method for improving a counting rate of a superconducting nanowire single photon detector, including: coupling an electrical attenuator in series with an output end of the superconducting nanowire single photon detector; the electrical attenuator includes an input end and an output end, and the input end of the electrical attenuator is coupled with the output end of the superconducting nanowire single photon detector.

Preferably, the electrical attenuator including a T-type electrical attenuator, a π-type electrical attenuator, an O-type electrical attenuator, an L-type electrical attenuator or an H-type electrical attenuator.

The present disclosure further provides a system for improving a counting rate of a superconducting nanowire single photon detector, including: a refrigeration system, a superconducting nanowire single photon detector, an electrical attenuator, a bias tree, an amplifier, a constant current source, and a counter; the superconducting nanowire single photon detector includes an input end, an output end, and a ground terminal, and the ground terminal of the superconducting nanowire single photon detector is grounded; the electrical attenuator includes an input end and an output end, and the input end of the electrical attenuator is coupled with the output end of the superconducting nanowire single photon detector; the electrical attenuator and the superconducting nanowire single photon detector are located in the refrigeration device; the bias tree includes an input end, a first output end, and a second output end, and the input end of the bias tree is coupled with the output end of the electrical attenuator; the constant current source is coupled with the first output end of the bias tree; the amplifier includes an input end, an output end, and a ground terminal, the input end of the amplifier is coupled with the second output end of the bias tree, and the ground terminal of the amplifier is grounded; and the counter is coupled with the output end of the amplifier.

Preferably, the refrigeration system includes a G-M refrigerator.

Preferably, the system for improving a counting rate of a superconducting nanowire single photon detector further includes some optical fibers and coaxial cables; the laser source is coupled with the optical attenuator via the optical fiber, the optical attenuator is coupled with the polarization controller via the optical fiber, the polarization controller is coupled with the superconducting nanowire single photon detector via the optical fiber; the superconducting nanowire single photon detector is coupled with the electrical attenuator via the coaxial cable, the electrical attenuator is coupled with the bias tree via the coaxial cable, the bias tree is coupled with the constant current source and the amplifier via the coaxial cable, and the amplifier is coupled with the counter via the coaxial cable.

Preferably, the superconducting nanowire single photon detector is a superconducting nanowire single photon detector.

Preferably, the electrical attenuator includes a T-type electrical attenuator, a π-type electrical attenuator, an O-type electrical attenuator, an L-type electrical attenuator, or an H-type electrical attenuator.

Preferably, the bias tree includes a capacitor and an inductor, the capacitor is coupled in series with the inductor, and an end of the capacitor far away from the inductor serves as the second output end of the bias tree, a coupling node of the capacitor and the inductor serves as the input end of the bias tree, and an end of the inductor far away from the capacitor serves as the first output end of the bias tree.

Preferably, the amplifier includes a coupling capacitor and a load impedance, the coupling capacitor is coupled in series with the load impedance, an end of the coupling capacitor far away from the load impedance serves as the input end of the amplifier, a coupling node of the coupling capacitor and the load impedance serves as the output end of the amplifier, and an end of the load impedance far away from the coupling capacitor serves as the ground terminal of the amplifier.

Preferably, the system for improving a counting rate of a superconducting nanowire single photon detector further includes a laser source, an optical attenuator, and a polarization controller; the optical attenuator includes an input end and an output end, and the input end of the optical attenuator is coupled with the laser source; and the polarization controller includes an input end and an output end, the input end of the polarization controller is coupled with the output end of the optical attenuator, and the output end of the polarization controller is coupled with the input end of the superconducting nanowire single photon detector.

Preferably, the system for improving a counting rate of a superconducting nanowire single photon detector further includes an optical fiber; the laser source is coupled with the optical attenuator via the optical fiber, the optical attenuator is coupled with the polarization controller via the optical fiber, the polarization controller is coupled with the superconducting nanowire single photon detector via the optical fiber.

In summary, the method and system for improving a counting rate of a superconducting nanowire single photon detector of the present disclosure has the following beneficial effects: the present disclosure couples the electrical attenuator in series with the output end of the superconducting nanowire single photon detector. Since the configuration of the electrical attenuator is a resistor network, it can act as a series resistor and can also reduce the response pulse amplitude of the superconducting nanowire single photon detector. The present disclosure can weaken the capacitor coupling between the superconducting nanowire single photon detector and the amplifier, reduce the influence of overshoot, reflection, and voltage offset on the superconducting nanowire single photon detector, thereby improving the counting rate of the superconducting nanowire single photon detector, and enabling the superconducting nanowire single photon detector to have high detection efficiency and high counting rate. At the same time, the system for improving a counting rate of a superconducting nanowire single photon detector of the present disclosure also has the advantages of simple structure, easy implementation, and low cost.

DESCRIPTION OF COMPONENT MARK NUMBERS

Figure 1:
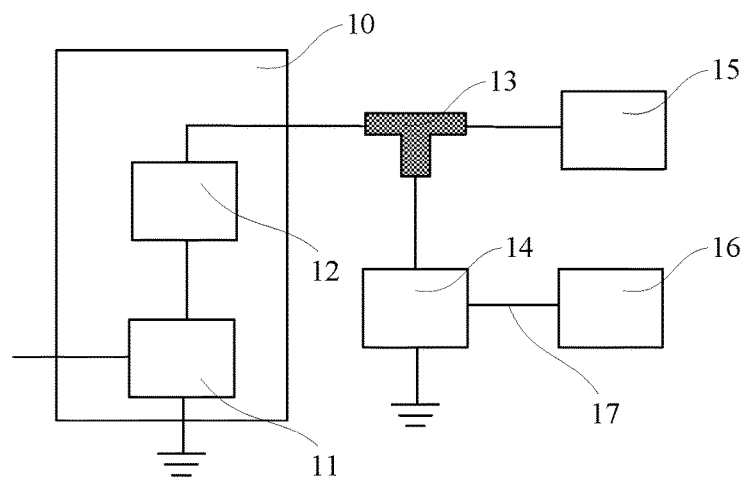
FIGS. 1 to 2 show schematic views of a system for improving a counting rate of a superconducting nanowire single photon detector according to the present disclosure.

10 Refrigeration system
11 Superconducting nanowire single photon detector
12 Electrical attenuator
13 Bias tree
14 Amplifier
15 Constant current source
16 Counter
17 Coaxial cable
18 Laser source
19 Optical attenuator
20 Polarization controller
21 Optical fiber

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 1-6. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated.

Referring to FIG. 1, the present disclosure provides a method for improving a counting rate of a superconducting nanowire single photon detector. The method includes the following operations: coupling an electrical attenuator 12 in series with an output end of the superconducting nanowire single photon detector 11; the electrical attenuator 12 includes an input end and an output end, and the input end of the electrical attenuator 12 is coupled with the output end of the superconducting nanowire single photon detector 11.

Figure 3:
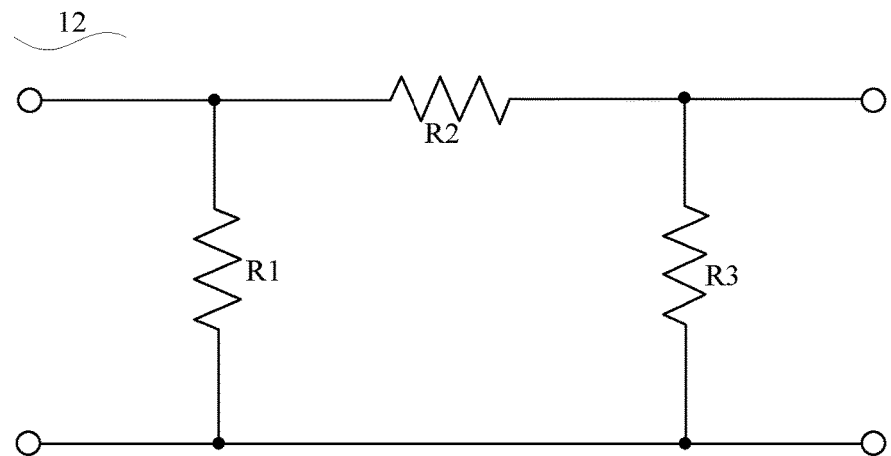
FIG. 3 shows an internal circuit view of a π-type electrical attenuator in the system for improving a counting rate of a superconducting nanowire single photon detector according to the present disclosure.

As an example, the electrical attenuator 12 includes a T-type electrical attenuator, a π-type electrical attenuator, an O-type electrical attenuator, an L-type electrical attenuator, or an H-type electrical attenuator. Taking π-type attenuator as an example, as shown in FIG. 3, the electrical attenuator 12 includes a first resistor R1, a second resistor R2, and a third resistor R3. The input end of the electrical attenuator 12 includes a first input node and a second input node, and the output end of the electrical attenuator 12 includes a first output node and a second output node. One end of the first resistor R1 is coupled with the first input node of the electrical attenuator 12, and the other end of the first resistor R1 is coupled with the second input node and the second output node of the electrical attenuator 12. One end of the second resistor R2 is coupled with the first resistor R1 and the first input node of the electrical attenuator 12, and the other end of the second resistor R2 is coupled with the third resistor R3 and the first output node of the electrical attenuator 12. One end of the third resistor R3 is coupled with an end of the second resistor R2 away from the first resistor R1 and the first output node of the electrical attenuator 12, and the other end of the third resistor R3 is coupled with the second input node and the second output node of the electrical attenuator 12.

Referring to FIG. 1, the present disclosure further provides a system for improving a counting rate of a superconducting nanowire single photon detector, including: a refrigeration device 10, a superconducting nanowire single photon detector (SNSPD) 14, an electrical attenuator 12, a bias tree 13, an amplifier 14, a constant current source 15, and a counter 16. The superconducting nanowire single photon detector 11 includes an input end, an output end, and a ground terminal, and the ground terminal of the superconducting nanowire single photon detector 11 is grounded. The electrical attenuator 12 includes an input end and an output end, and the input end of the electrical attenuator 12 is coupled with the output end of the superconducting nanowire single photon detector 11. The electrical attenuator 12 and the superconducting nanowire single photon detector 11 are located in the refrigeration device 10. The bias tree 13 includes an input end, a first output end, and a second output end, and the input end of the bias tree 13 is coupled with the output end of the electrical attenuator 12. The constant current source 15 is coupled with the first output end of the bias tree 13. The amplifier 14 includes an input end, an output end, and a ground terminal, the input end of the amplifier 14 is coupled with the second output end of the bias tree 13, and the ground terminal of the amplifier 14 is grounded. The counter 16 is coupled with the output end of the amplifier 14.

As an example, the refrigeration device 10 may be any existing device that can achieve cooling and temperature reduction. Preferably, in this embodiment, the refrigeration system 10 is a G-M refrigerator. The G-M refrigerator is a low-temperature regenerative gas refrigerator invented by GIFFord W E and McMahon H O in 1959.

As an example, the system for improving a counting rate of a superconducting nanowire single photon detector further includes a coaxial cable 17. The superconducting nanowire single photon detector 11 is coupled with the electrical attenuator 12 via a first section of the coaxial cable 17, the electrical attenuator 12 is coupled with the bias tree 13 via a second section of the coaxial cable 17, the bias tree 13 is coupled with the constant current source 15 and the amplifier 14 via a third section of the coaxial cable 17, and the amplifier 14 is coupled with the counter 16 via a fourth section of the coaxial cable 17.

As an example, the superconducting nanowire single photon detector 11 may be, but not limited to, a superconducting nanowire single photon detector based on an NbN thin film. In other examples, the superconducting nanometer single photon detector 14 may be any other existing superconducting nanowire single photon detector.

Figure 2:
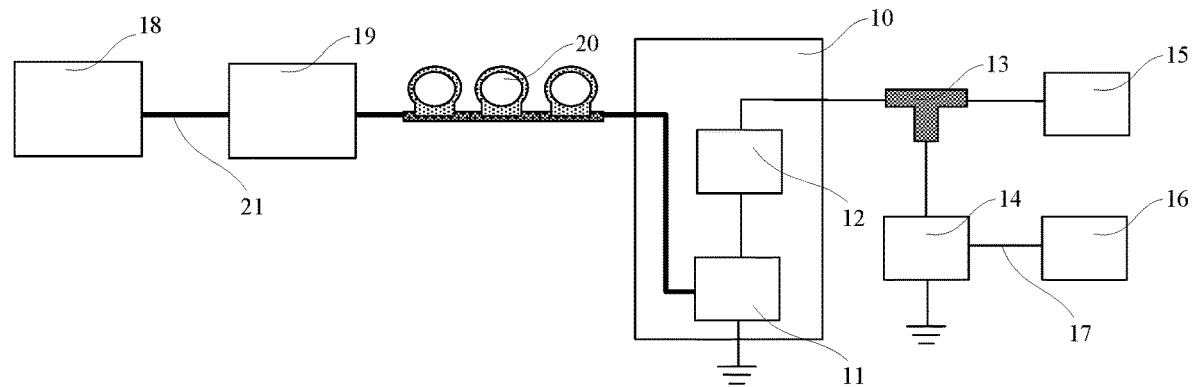

As an example, as shown in FIG. 2, the system for improving a counting rate of a superconducting nanowire single photon detector further includes a laser source 18, an optical attenuator 19, and a polarization controller 20. The optical attenuator 19 includes an input end and an output end, and the input end of the optical attenuator 19 is coupled with the laser source 18. The polarization controller 20 includes an input end and an output end, the input end of the polarization controller 20 is coupled with the output end of the optical attenuator 19, and the output end of the polarization controller 20 is coupled with the input end of the superconducting nanowire single photon detector 11.

As an example, the system for improving a counting rate of a superconducting nanowire single photon detector further includes an optical fiber 21. The laser source 18 is coupled with the optical attenuator 19 via a first section of the optical fiber 21, the optical attenuator 19 is coupled with the polarization controller 20 via a second section of the optical fiber 21, and the polarization controller 20 is coupled with the superconducting nanowire single photon detector 11 via a third section of the optical fiber 21.

As an example, the electrical attenuator 12 includes a T-type electrical attenuator, a π-type electrical attenuator, an O-type electrical attenuator, or an H-type electrical attenuator. Taking π-type attenuator as an example, as shown in FIG. 3, the electrical attenuator 12 includes a first resistor R1, a second resistor R2, and a third resistor R3. The input end of the electrical attenuator 12 includes a first input node and a second input node, and the output end of the electrical attenuator 12 includes a first output node and a second output node. One end of the first resistor R1 is coupled with the first input node of the electrical attenuator 12, and the other end of the first resistor R1 is coupled with the second input node and the second output node of the electrical attenuator 12. One end of the second resistor R2 is coupled with the first resistor R1 and the first input node of the electrical attenuator 12, and the other end of the second resistor R2 is coupled with the third resistor R3 and the first output node of the electrical attenuator 12. One end of the third resistor R3 is coupled with an end of the second resistor R2 away from the first resistor R1 and the first output node of the electrical attenuator 12, and the other end of the third resistor R3 is coupled with the second input node and the second output node of the electrical attenuator 12.

Figure 4:
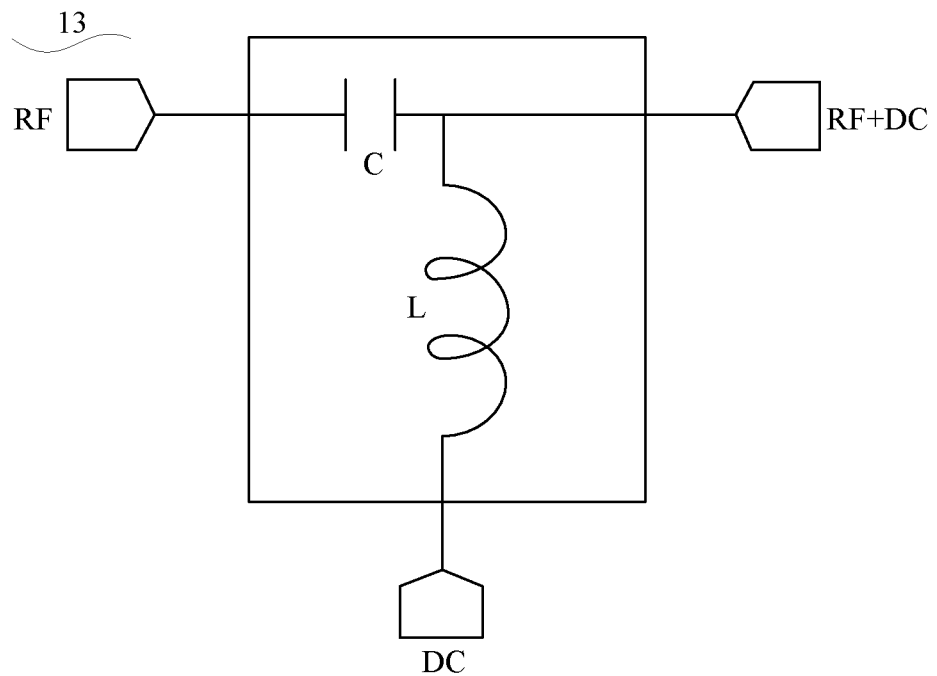
FIG. 4 shows a circuit view inside a bias tree in the system for improving a counting rate of a superconducting nanowire single photon detector according to the present disclosure.

As an example, as shown in FIG. 4, the bias tree 13 includes a capacitor C and an inductor L, the capacitor C is coupled in series with the inductor L, and an end of the capacitor C away from the inductor L serves as the second output end of the bias tree 13, a coupling node of the capacitor C and the inductor L serves as the input end of the bias tree 13, and an end of the inductor L away from the capacitor C serves as the first output end of the bias tree 13. The input end of the bias tree 13 inputs DC&RF (i.e. direct current and radio frequency signals). The bias tree 13 is used to isolate the direct current and radio frequency signals, the isolated direct current signals are output through the first output end (that is, the first output end is a DC end), and the isolated radio frequency signals are output through the second output end (that is, the second output end is an RF end).

Figure 5:
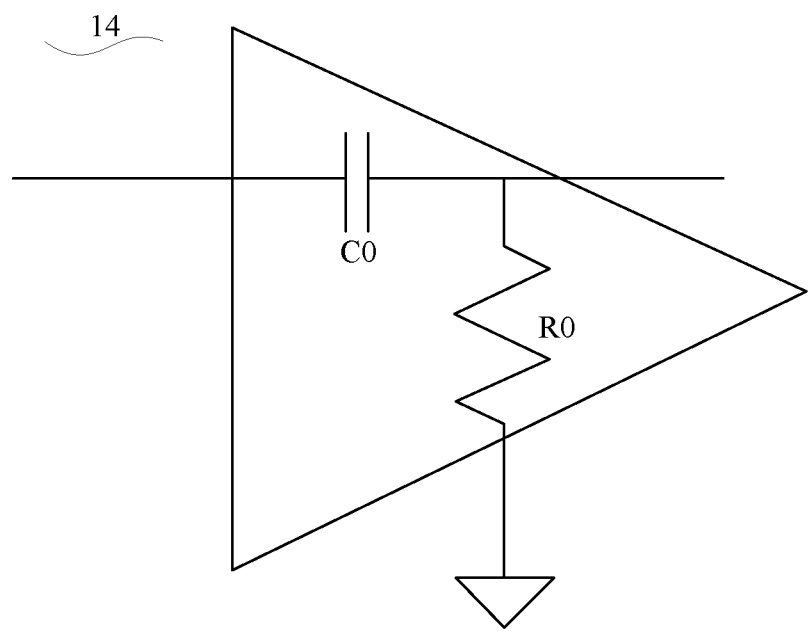
FIG. 5 shows a circuit view inside an amplifier in the system for improving a counting rate of a superconducting nanowire single photon detector according to the present disclosure.

As an example, as shown in FIG. 5, the amplifier 14 includes a coupling capacitor C0 and a load impedance R0. The coupling capacitor C0 is coupled in series with the load impedance R0, an end of the coupling capacitor C0 away from the load impedance R0 serves as the input end of the amplifier 14. A coupling node of the coupling capacitor C0 and the load impedance R0 serves as the output end of the amplifier 14, and an end of the load impedance R0 away from the coupling capacitor C0 serves as the ground terminal of the amplifier 14.

In the system without the electrical attenuator 12 (the system does not have the electrical attenuator 12 in FIG. 1 of the present disclosure, other components and connection relationships are the same as those in the present disclosure), the superconducting nanowire single photon detector 11 is coupled with the amplifier 14 via the bias tree 13. At this time, the counting rate of the superconducting nanowire single photon detector 11 is not only limited by the dynamic inductance of the superconducting nanowire single photon detector, but also affected by the coupling capacitor C0 in the amplifier 14. The independent circuit of the superconducting nanowire single photon detector 11 is a second-order RLC series resonance circuit formed by the dynamic inductance of the superconducting nanowire single photon detector 11, the coupling capacitance C0 of the amplifier 14, and the load impedance R0. On the one hand, the resonance generated by the second-order RLC series resonant circuit will generate overshoot at the end of the response waveform of the superconducting nanowire single photon detector. On the other hand, because the response waveform of the superconducting nanowire single photon detector is wide, when a single photon pulse with a high repetition rate is input, the coupling capacitor C0 of the amplifier 14 cannot be charged and discharged in time, and the charge accumulated on the coupling capacitor C0 causes the zero voltage baseline of the response waveform to offset downward. Since the superconducting nanowire single photon detector 11 is coupled in parallel with the amplifier 14, the voltage offset increases the actual bias current of the superconducting nanowire single photon detector 11, the actual bias current exceeds the critical current, and the superconducting nanowire single photon detector 11 quenches superconductivity.

Therefore, in order to increase the counting rate of the superconducting nanowire single photon detector 11, the coupling between the superconducting nanowire single photon detector 11 and the amplifier 14 must be weakened to reduce the influence of overshoot, reflection, and voltage offset on the superconducting nanowire single photon detector 11. The voltage offset is caused by the slow charging and discharging speed of the coupling capacitor C0 of the amplifier 14. Since the coupling capacitor C0 of the amplifier 14 remains unchanged, we can reduce the response waveform amplitude and pulse width of the superconducting nanowire single photon detector 11, to accelerate the charging and discharging speed of the coupling capacitor C0 of the amplifier 14. The overshoot of the superconducting nanowire single photon detector 11 can be achieved by reducing the dynamic inductance of the superconducting nanowire single photon detector 11 and the series resistance of the superconducting nanowire single photon detector 11. The system for improving a counting rate of a superconducting nanowire single photon detector of the present disclosure adds the electrical attenuator 12 between the superconducting nanowire single photon detector 11 and the bias tree 13. The configuration of the electrical attenuator 12 is a resistor network, which can serve as a series resistor and reduce the response pulse amplitude of the superconducting nanowire single photon detector 11. The system for improving a counting rate of a superconducting nanowire single photon detector of the present disclosure can reduce the influence of overshoot, reflection and voltage offset on the superconducting nanowire single photon detector 11, thereby improving the counting rate of the superconducting nanowire single photon detector 11, and enabling the superconducting nanowire single photon detector 11 to have high detection efficiency.

Figure 6:
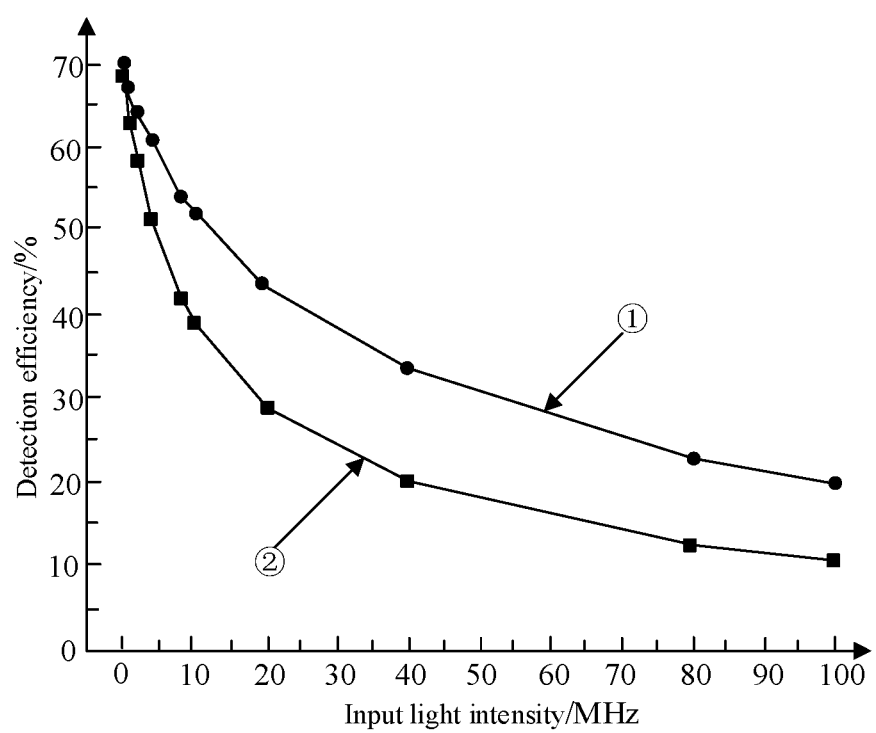
FIG. 6 shows a comparison view of the detection efficiency with the change of light intensity of a system for improving a counting rate of a superconducting nanowire single photon detector according to the present disclosure and a system with superconducting nanowire single photon detector coupled in parallel with a resistor of 50 ohms, in the present disclosure, the superconducting nanowire single photon detector is an NbN based superconducting nanowire single photon detector with a diameter of 15 μm; curve ① is a curve of the system in the present disclosure in which the electrical attenuator is a 6 dB electric attenuator, and curve ② is a curve of the system in which the superconducting nanowire single photon detector is coupled in parallel with a resistor of 50 ohms.

Referring to FIG. 6, the superconducting nanowire single photon detector 11 with a diameter of 15 μm based on an NbN film is taken as an example, and is compared with a superconducting nanowire single photon detector coupled in parallel with a resistor of 50 ohms. It can be seen that under the same light intensity, the superconducting nanowire single photon detector 11 in the present disclosure has a higher detection efficiency.

In summary, the present disclosure provides a method and system for improving a counting rate of a superconducting nanowire single photon detector. The method includes: coupling an electrical attenuator in series with an output end of the superconducting nanowire single photon detector; the electrical attenuator includes an input end and an output end, and the input end of the electrical attenuator is coupled with the output end of the superconducting nanowire single photon detector. The present disclosure couples the electrical attenuator in series with the output end of the superconducting nanowire single photon detector. Since the configuration of the electrical attenuator is a resistor network, it can act as a series resistance and can also reduce the response pulse amplitude of the superconducting nanowire single photon detector. The present disclosure can weaken the circuit coupling between the superconducting nanowire single photon detector and the amplifier, reduce the influence of overshoot, reflection, and voltage offset on the superconducting nanowire single photon detector, thereby improving the counting rate of the superconducting nanowire single photon detector, while keeping the detection efficiency high. At the same time, the system for improving a counting rate of a superconducting nanowire single photon detector of the present disclosure also has the advantages of simple structure, easy implementation, and low cost.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those skilled in the art without departing from the spirit and scope of the disclosure will be covered by the appended claims.

We claim:

1. A method for improving a counting rate of a superconducting nanowire single photon detector, comprising:
    coupling an electrical attenuator in series with an output end of the superconducting nanowire single photon detector;
    wherein the electrical attenuator includes an input end and an output end, and the input end of the electrical attenuator is coupled with the output end of the superconducting nanowire single photon detector;
    wherein the electrical attenuator comprises a T-type electrical attenuator, a π-type electrical attenuator, an O-type electrical attenuator, an L-type electrical attenuator, or an H-type electrical attenuator.

2. A system for improving a counting rate of a superconducting nanowire single photon detector, comprising: a refrigeration system, a superconducting nanowire single photon detector, an electrical attenuator, a bias tree, an amplifier, a constant current source, and a counter; wherein
    the superconducting nanowire single photon detector includes an input end, an output end, and a ground terminal, and the ground terminal of the superconducting nanowire single photon detector is grounded;
    the electrical attenuator includes an input end and an output end, and the input end of the electrical attenuator is coupled with the output end of the superconducting nanowire single photon detector; the electrical attenuator and the superconducting nanowire single photon detector are located in the refrigeration device;

the bias tree includes an input end, a first output end, and a second output end, and the input end of the bias tree is coupled with the output end of the electrical attenuator;

the constant current source is coupled with the first output end of the bias tree;

the amplifier includes an input end, an output end, and a ground terminal, the input end of the amplifier is coupled with the second output end of the bias tree, and the ground terminal of the amplifier is grounded;

the counter is coupled with the output end of the amplifier; and the electrical attenuator comprises a T-type electrical attenuator, a π-type electrical attenuator, an O-type electrical attenuator, an L-type electrical attenuator, or an H-type electrical attenuator.

3. The system for improving a counting rate of a superconducting nanowire single photon detector according to claim 2, wherein the refrigeration system comprises a G-M refrigerator.

4. The system for improving a counting rate of a superconducting nanowire single photon detector according to claim 2, further comprising a coaxial cable; wherein the superconducting nanowire single photon detector is coupled with the electrical attenuator via the coaxial cable, the electrical attenuator is coupled with the bias tree via the coaxial cable, the bias tree is coupled with the constant current source and the amplifier via the coaxial cable, and the amplifier is coupled with the counter via the coaxial cable.

5. The system for improving a counting rate of a superconducting nanowire single photon detector according to claim 2, wherein the superconducting nanowire single photon detector is a superconducting nanowire single photon detector based on an NbN thin film.

6. The system for improving a counting rate of a superconducting nanowire single photon detector according to claim 2, wherein the bias tree includes a capacitor and an inductor, wherein the capacitor is coupled in series with the inductor, and an end of the capacitor far away from the inductor serves as the second output end of the bias tree, a coupling node of the capacitor and the inductor serves as the input end of the bias tree, and an end of the inductor far away from the capacitor serves as the first output end of the bias tree.

7. The system for improving a counting rate of a superconducting nanowire single photon detector according to claim 2, wherein the amplifier includes a coupling capacitor and a load impedance, wherein the coupling capacitor is coupled in series with the load impedance, an end of the coupling capacitor far away from the load impedance serves as the input end of the amplifier, a coupling node of the coupling capacitor and the load impedance serves as the output end of the amplifier, and an end of the load impedance far away from the coupling capacitor serves as the ground terminal of the amplifier.

8. The system for improving a counting rate of a superconducting nanowire single photon detector according to claim 2, further comprising a laser source, an optical attenuator, and a polarization controller; wherein the optical attenuator includes an input end and an output end, and the input end of the optical attenuator is coupled with the laser source; and the polarization controller includes an input end and an output end, the input end of the polarization controller is coupled with the output end of the optical attenuator, and the output end of the polarization controller is coupled with the input end of the superconducting nanowire single photon detector.

9. The system for improving a counting rate of a superconducting nanowire single photon detector according to claim 8, further comprising an optical fiber; wherein the laser source is coupled with the optical attenuator via the optical fiber, the optical attenuator is coupled with the polarization controller via the optical fiber, the polarization controller is coupled with the superconducting nanowire single photon detector via the optical fiber.

\* \* \* \* \*